(12) United States Patent
Su et al.

(10) Patent No.: US 11,081,030 B2
(45) Date of Patent: Aug. 3, 2021

(54) SHIFT REGISTER CIRCUIT AND DRIVE METHOD THEREOF, SCAN DRIVE CIRCUIT AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Guohuo Su, Beijing (CN); Zhihua Sun, Beijing (CN); Xu Zhang, Beijing (CN); Weichao Ma, Beijing (CN); Ning Zhang, Beijing (CN); Jituo Tang, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 354 days.

(21) Appl. No.: 16/077,890

(22) PCT Filed: Feb. 8, 2018

(86) PCT No.: PCT/CN2018/075748
§ 371 (c)(1),
(2) Date: Aug. 14, 2018

(87) PCT Pub. No.: WO2019/019608
PCT Pub. Date: Jan. 31, 2019

(65) Prior Publication Data
US 2021/0027684 A1    Jan. 28, 2021

(30) Foreign Application Priority Data

Jul. 24, 2017   (CN) .......................... 201710608301.6

(51) Int. Cl.
*G09G 3/20*   (2006.01)

(52) U.S. Cl.
CPC ....... *G09G 3/20* (2013.01); *G09G 2310/0267* (2013.01); *G09G 2310/08* (2013.01)

(58) Field of Classification Search
None
See application file for complete search history.

(56) References Cited

U.S. PATENT DOCUMENTS

2007/0001987 A1   1/2007   Chun et al.
2009/0256794 A1*  10/2009  Jang ....................... G11C 19/28
                                                            345/100

(Continued)

FOREIGN PATENT DOCUMENTS

| CN | 102819998 A | 12/2012 |
| CN | 106023914 A | 10/2016 |
| CN | 107154236 A | 9/2017 |

OTHER PUBLICATIONS

International Search Report and Written Opinion for International Appl. No. PCT/CN2018/074748, dated Apr. 18, 2018.

*Primary Examiner* — Benjamin X Casarez
(74) *Attorney, Agent, or Firm* — Dinsmore & Shohl LLP

(57) ABSTRACT

A shift register circuit is provided that has an input terminal and an output terminal, and includes: an input module connected to the input terminal and a first node when the input, terminal is active, sets the first node to active; a reset module connected to the input terminal and a second node when the input terminal is active, sets the second node to inactive; an output module connected to the first node and the output terminal when the first node is active, sets the output terminal to active with a clock signal; a pull down module connected to the first node, the output terminal and the second node when the second node is active, sets the first node and the output terminal to inactive.

10 Claims, 4 Drawing Sheets

(56) References Cited

U.S. PATENT DOCUMENTS

| | | | |
|---|---|---|---|
| 2010/0177082 A1 | 7/2010 | Joo et al. | |
| 2011/0057926 A1* | 3/2011 | Shang | G11C 19/28 |
| | | | 345/213 |
| 2012/0262438 A1* | 10/2012 | Shang | G11C 19/28 |
| | | | 345/211 |
| 2014/0133621 A1* | 5/2014 | Shang | G11C 19/184 |
| | | | 377/67 |
| 2016/0086562 A1* | 3/2016 | Tan | G09G 3/3677 |
| | | | 345/215 |
| 2016/0335962 A1* | 11/2016 | Xiao | G09G 3/3677 |
| 2018/0108291 A1* | 4/2018 | Hao | G06F 3/04184 |
| 2018/0233208 A1* | 8/2018 | Feng | G11C 19/28 |
| 2020/0090610 A1* | 3/2020 | Wang | G09G 3/3677 |

\* cited by examiner

SHIFT REGISTER CIRCUIT AND DRIVE METHOD THEREOF, SCAN DRIVE CIRCUIT AND DISPLAY DEVICE

CROSS-REFERENCE TO RELATED APPLICATIONS

The present application is a U.S. National Stage Application under 35 U.S.C. § 371 of International Patent Application No. PCT/CN2018/075748 filed on Feb. 8, 2018, which claims priority to China Patent Application No. 201710608301.6 filed on Jul. 24, 2017, the disclosure of both of which is incorporated by reference herein in entirety.

FIELD

The present disclosure relates to a shift register circuit and a drive method thereof, a scan drive circuit, and a display device.

BACKGROUND

For the Gate driver On Array (GOA) technology in comparison with a traditional technology, not only a circuit board which bears the gate driver can be omitted, achieving a symmetrical design on both sides of a display panel, but also a chip binding area and a wiring area such as a fan-out area at the edge of the display panel can be omitted, which helps achieve a narrow frame design. Meanwhile, since a chip binding process in the row direction can be omitted in the GOA technology, it is also a great help to improvement the overall production capacity and the yield.

SUMMARY

In a first aspect, some embodiments of the present disclosure provide a shift register circuit comprising an input terminal, a reset terminal and an output terminal, further comprising: an input circuit which is connected to the input terminal and a first node respectively, and is configured to, when the input terminal is at an active level, set the first node to an active level; an output circuit which is connected to the first node and the output terminal respectively, and is configured to, when the first node is at the active level, set the output terminal to an active level with use of a clock signal; a reset circuit which is connected to the reset terminal, the first node and the output terminal respectively, and is configured to, when the reset terminal is at the active level, set the first node and the output terminal to an inactive level; a pull down control circuit which is connected to the reset terminal and a second node respectively, and is configured to set the second node to an active level in a time period in which the first node is at the active level, and to cause a potential height at the second node to change in a direction of getting away from the inactive level when the reset terminal is changed from the inactive level to the active level; a first pull down circuit which is connected to the second node and the output terminal respectively, and is configured to, when a control signal which is connected thereto is at the active level and the second node is at the active level, set the output terminal to the inactive level at a rate which is corresponding to the potential height at the second node.

In some embodiments, the pull down control circuit may include a first transistor and a first capacitor, and the first pull down circuit includes a second transistor and a third transistor; wherein the first transistor has a gate connected to the input terminal or the first node, a first pole connected to the first node, and a second pole connected to the second node; the first capacitor has a first terminal connected to the second node and a second terminal connected to the reset terminal; the second transistor has a gate connected to the control signal or the reset terminal, a first pole connected to the second node, and a second pole connected to a gate of the third transistor; the third transistor has a first pole connected to the output terminal, and a second pole connected to the inactive level voltage of the output terminal; wherein the active level of the control signal is a level which enables the second transistor to be turned on between the first pole and the second pole thereof; and wherein the first pole is one of a source and a drain, and the second pole is the other.

In some embodiments, the output circuit includes a second capacitor and a fourth transistor; wherein, the second capacitor has a first terminal connected to the first node, and a second terminal connected to the output terminal; the fourth transistor has a gate connected to the first node, a first pole connected to the clock signal, and a second pole connected to the output terminal.

In some embodiments, the reset circuit includes a fifth transistor and a sixth transistor; wherein, the fifth transistor has a gate connected to the reset terminal, a first pole connected to the first node, and a second pole connected to the inactive level voltage of the first node; the sixth transistor has a gate connected to the reset terminal, a first pole connected to the output terminal, and a second pole connected to the inactive level voltage of the output terminal.

In some embodiments, the input circuit includes a seventh transistor; wherein, the seventh transistor has a gate and a first pole connected to the input terminal, and a second pole connected to the first node.

In some embodiments, the shift register circuit further includes: a second pull down circuit which is connected to the second node and the first node respectively, and is configured to, when a control signal which is connected thereto is at the active level and the second node is at the active level, set the first node to the inactive level at a rate which is corresponding to the potential height at the second node.

In some embodiments, the second pull down circuit includes an eighth transistor and a ninth transistor; wherein, the eighth transistor has a gate connected to the control signal, a first pole connected to the second node, a second pole connected to a gate of the ninth transistor; the ninth transistor has a first pole connected to the first node, and a second pole connected to the inactive level voltage of the first node; wherein the active level of the control signal is a level which enables the eighth transistor to be turned on between the first pole and the second pole; and wherein the first pole is one of a source and a drain, and the second pole is the other.

In a second aspect, some embodiments of the present disclosure provide a method of driving the shift register circuit according to any of the above-mentioned shift register circuit comprising: when the reset terminal is changed from the inactive level to the active level, changing the control signal which is connected to the first pull down circuit from the inactive level to the active level.

In a third aspect, some embodiments of the present disclosure provide an array substrate comprising at least one scan drive circuit, the scan drive circuit comprising multiple stages of any of the shift register circuits as above-mentioned.

In a fourth aspect, some embodiments of the present disclosure provide a display device comprising any of the array substrates as above-mentioned.

BRIEF DESCRIPTION OF THE DRAWINGS

In order to explain technical solutions in the embodiments of the present disclosure more clearly, accompanying drawings used in the description of embodiments will be briefly described in the following. Evidently, the accompanying drawings as described below are only some embodiments of the present disclosure, and all reasonable variants of these accompanying drawings are also embraced within the scope of the present disclosure.

DETAILED DESCRIPTION OF EXAMPLE EMBODIMENTS

In order to make the goals, technical solutions and advantages of the present disclosure more clear, embodiments of the present disclosure will be further explained in detail in conjunction with the drawings below. Obviously, the embodiments described herein are just a part of embodiments of the present disclosure, but not all of them. All other embodiments obtained on basis of the described embodiments of the present disclosure by those ordinary skilled in the art without creative labor fall within the scope of the present disclosure. Unless defined otherwise, a technical term or a scientific term used by the present disclosure should have a meaning as generally understood by those skilled in the art to which the present disclosure belongs. The terms "first", "second" or similar terms used in the present disclosure are not intended to refer to any order, quantity or importance, but is simply used to distinguish different constituent parts. The term "include" or "comprise" or a similar term means that an element or object which appears before the term covers an element or object or an equivalent thereof which are listed after the term, but not preclude other elements or objects. The term "connect" or a similar term shall not be limited to a physical or mechanical connection, but may include an electrical connection, and the connection may be direct or indirect.

As a basic circuit unit of a gate driver adopting the GOA technology, a shift register circuit may need to be controlled to pull up and pull down the potential on a row scanning line to which it is connected. Since a too slow potential pull down rate may easily result in display abnormality, in the relevant art, a method of increasing the size of the transistor or designing a plurality of transistors to pull down together is usually adopted to increase the potential pull down rate on the row scanning line. However, increasing the designed size or the number of the transistors will cause the shift register unit to occupy more layout space, which is not desirable for narrowing the frame of the display product; moreover, with increasing in the designed size or the number, the leakage of the transistors also becomes more difficult to be controlled, there exists such a problem that the conventional manner of potential pull-down can not satisfy application demands.

Figure 1:
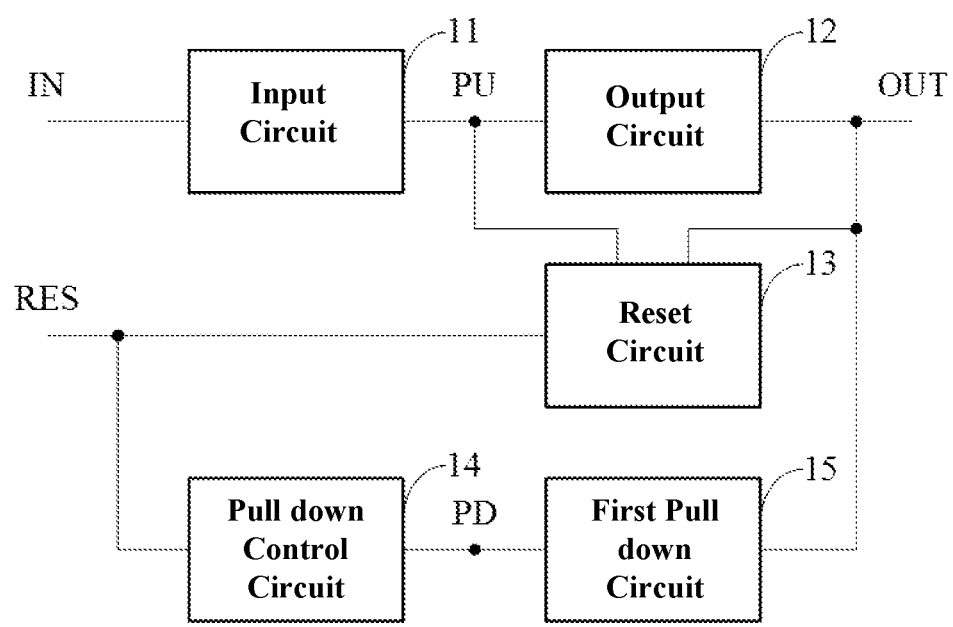
FIG. 1 is a structural block diagram of a shift register circuit provided by some embodiments of the present disclosure.

FIG. 1 is a structural block diagram of a shift register circuit provided by an embodiment of the present disclosure. With reference to FIG. 1, the shift register circuit of an embodiment of the present disclosure includes an input terminal IN, a reset terminal RES and an output terminal OUT. The shift register circuit further includes:

an input circuit 11 which is connected to the input terminal IN and a first node PU respectively, and is configured to, when the input terminal IN is at an active level, set the first node PU to an active level;

an output circuit 12 which is connected to the first node PU and the output terminal OUT respectively, and is configured to, when the first node PU is at the active level, set the output terminal OUT to an active level;

a reset circuit 13 which is connected to the reset terminal RES, the first node PU and the output terminal OUT 13 respectively, and is configured to, when the reset terminal RES is at the active level, set the first node PU and the output terminal OUT to an inactive level;

a pull down control circuit 14 which is connected to the reset terminal RES and the second node PD respectively, and is configured to set the second node PD to the active level in a time period in which the first node PU is at the active level, and configured to, when the reset terminal RES changes from the inactive level to the active level, cause the potential height at the second node PD to change in a direction of getting away from the inactive level;

a first pull down circuit 15 which is connected to the second node PD and the output terminal OUT respectively, and is configured to, when a control signal with which it is connected is at the active level and the second node PD is at the active level, set the output terminal OUT to the inactive level at a rate corresponding to the potential height at the second node PD. In some embodiments, the further the potential height at the second node PD gets away from the inactive level, the higher the rate at which the first pull down circuit 15 sets the output terminal OUT to the inactive level.

It is to be noted that, the active level and the inactive level in this description may refer to, with respect to a specific circuit node, two different voltage ranges configured in advance (both taking a common terminal voltage as a reference) respectively. In some embodiments, the active levels of all circuit nodes may be the high level in the digital circuit where they lie. In some other embodiments, the active levels of all circuit nodes may be the high level in the digital circuit where they lie. In other some embodiments, the active levels at the input terminal IN and the reset terminal RES may be the low level in the digital circuit where they lie, whereas the active levels at the output terminal OUT, the first node PU and the second node PD may be the high level in the digital circuit where they lie. Of course, the manner of setting the active level and the inactive level shall not be limited to above examples.

It can be seen that, according to the embodiment of the present disclosure, based on the configuration of the pull down control circuit and the first pull down circuit, the potential height of the second node can be further changed on the basis of the original active level in the direction of getting away from the inactive level (e.g. it may be changed to a higher level of a higher potential on the basis of a high level) by changing the level at the reset terminal of the shift register circuit, so that it is possible to achieve fast pulling-down or fast pulling-up the output terminal through the first pull down circuit, and the problem that the design method for the potential pulling down in the relevant art can not satisfy application demands can be solved. In comparison with to the relevant art, the shift register circuit of the embodiment of the present disclosure can use transistors with smaller size and fewer number to achieve faster potential pulling down, thereby have optimized signal output performance.

Figure 2:
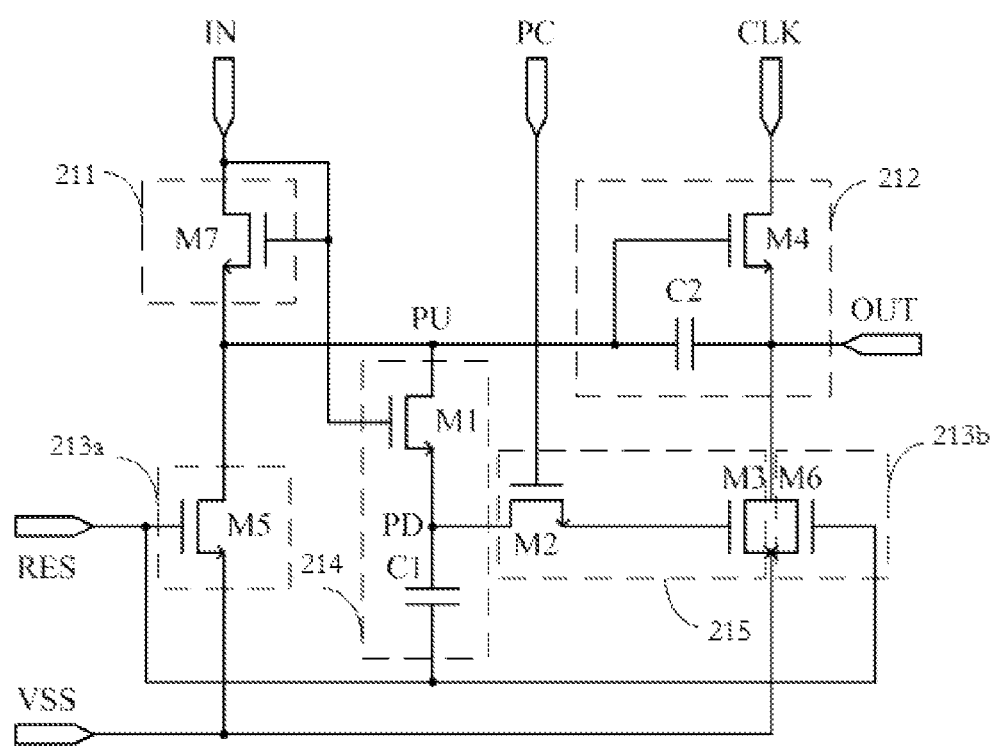
FIG. 2 is a circuit structure diagram of a shift register circuit provided by some other embodiments of the present disclosure.

FIG. 2 is a circuit structure diagram of a shift register circuit provided by another embodiment of the present disclosure. With reference to FIG. 2, the shift register circuit of the present embodiment includes an input circuit 211, an output circuit 212, a reset circuit 213 (including a first part 213a and a second part 213b), a pull down control circuit 214 and a first pull down circuit 215. In the following, a circuit structure of each part will be introduced and described.

As shown in FIG. 2, the input circuit 211 includes a seventh transistor M7, the seventh transistor M7 having a gate and a first pole connected to the input terminal IN, and a second pole connected to the first node PU. It is to be noted that, the first pole and the second pole may be one of a source and a drain respectively. For example, in the description of the exemplary embodiment, as an example, the first pole is the drain, the second pole is the source. According to a different specific type of the transistor, the respective connection relationships of the source and the drain may be set to match the direction of the current flowing through the transistor. When the transistor has a structure in which the source and the drain are symmetrical, the source and the drain may be regarded as two poles which are not particularly distinguished. As such, when the input terminal IN is at the high level, the seventh transistor M7 is turned on under the action of the high level of the gate, the first node PU is pulled up to the high level, and the above mentioned function of, when the input terminal IN is at a active level, setting the first node PU to the active level is achieved. In some possible alternatives, one of the source and the drain of the seventh transistor M7 which is connected to the input terminal IN may instead be connected with the active level of the first node NJ, which likewise may achieve the above mentioned function. Of course, the circuit structure of the input circuit 211 shall not be limited to above forms.

As shown in FIG. 2, the output circuit 212 includes a fourth transistor M4 and a second capacitor C2, wherein the fourth transistor M4 has a gate connected to the first node PU, a first pole connected to a first clock signal line CLK, and an other pole connected to the output terminal OUT; the second capacitor C2 has a first terminal connected to the first node PU, and a second pole connected to the output terminal OUT. For example, the first clock signal line CLK and a second clock signal line CLKB (not shown in FIG. 2) may be loaded with one of a positive phase clock signal and a negative phase clock signal, respectively. As such, when the first node PU is at the high level, the fourth transistor M4 is turned on under the action of the high level of the gate, so that the output terminal OUT can be pulled up to the high level with use of the high level on the first clock signal line CLK so as to achieve the above mentioned function of, when the first node PU is at the active level, setting the output terminal OUT to the active level with use of the clock signal. Of course, the circuit structure of the output circuit 12 shall not be limited to above forms.

As shown in FIG. 2, the reset circuit 213 includes a fifth transistor M5 and a sixth transistor M6. The fifth transistor has a gate connected to the reset terminal RES, a first pole connected to the first node PU, a second pole connected to an inactive level voltage line VSS which may provide the inactive level of the first node PU. The sixth transistor M6 has a gate connected to the reset terminal RES, a first pole connected to the output terminal OUT, a second pole connected to an inactive level voltage line VSS which may provide the inactive level of the output terminal OUT. For example, when the reset terminal RES is at the high level, the fifth transistor M5 and the sixth transistor M6 are turned on under the action of the high level of the gates, so that the first node PU and the output terminal OUT are pulled down to a low level, to achieve the above mentioned function of, when the reset terminal RES is at the active level, setting the first node PU and the output terminal OUT to the inactive level. Of course, the circuit structure of the reset circuit 213 shall not be limited to above forms.

As shown in FIG. 2, the pull down control circuit 214 includes a first transistor M1 and a first capacitor C1. The first transistor M1 has a gate connected to the input terminal IN, a first pole connected to the first node PU, and a second pole connected to the second node PD. A first terminal of the first capacitor is connected to the second node PD, and a second terminal thereof is connected to the reset terminal RES. For example, when the input terminal IN is at the high level, the first transistor M1 is turned on under the action of the high level at the gate, and since the first node PU has been changed to the high level under the action of the input circuit 11, at this time the first transistor M1 may also pull up the second node PD to a high level, and cause the first capacitor C1 to be charged, a voltage across two terminals being maintained. Thereafter, for example, when the reset terminal RES changes from the low level to the high level, a potential changing will take place at the second node PD in a same direction and with a same amplitude as that at the reset terminal RES, i.e. jumping to a higher level with a higher potential, under the action of the first capacitor C1. That is, this structure may achieve the above mentioned function of setting the second node PD to the active level in the time period in which the first node PU is at the active level, and causing the potential height at the second node PD to change in a direction of getting away from the inactive level when the reset terminal RES is changed from the inactive level to the active level. In some other embodiments, the gate of the first transistor M1 may instead be connected to the first node PU, i.e. the first transistor M1 may be turned on when the first node PU is at the high level, and may be turned off when the reset circuit 213 sets the first node PU to the low level; setting the second node PD to the active level in the time period in which the first node PU is at the active level as above mentioned can be achieved. Of course, the circuit structure of the pull down control circuit 214 shall not be limited to above forms.

As shown in FIG. 2, the first pull down circuit 215 includes a second transistor M2 and a third transistor M3. The second transistor has a gate connected to a control signal PC, a first pole connected to the second node PD, a second pole connected to a gate of the third transistor M3. A first pole of the third transistor M3 is connected to the output terminal OUT, and a second pole thereof is connected to the inactive level voltage line VSS which can provide the inactive level of the output terminal OUT. As such, for example, when the control signal PC and the second node PD are both at the high level, the second transistor M2 and the third transistor M3 are both turned on, so that the potential at the gate of the third transistor M3 is consistent or approximately consistent with the potential at the second node PD. Moreover, the higher the potential at the gate of the third transistor M3 is, the larger the source-drain current thereof is, and the higher the rate at which the potential of the output terminal OUT is pulled down is. That is, the above mentioned function of, when the connected control signal is at the active level and the second node PD is at the active level, pulling down the potential at the output terminal OUT at a rate corresponding to the potential height at the second node PD, is achieved. In some embodiments, the gate of the second transistor M2 is connected to the reset terminal RES, thereby the control signal PC is provided by the reset terminal RES, so that after the reset terminal RES is changed from the low level to the high level, the gate of the third transistor M3 and the second node PD can both be at the above mentioned higher level with the higher potential, thus the output terminal OUT can be pulled down fast. Of course, the circuit structure of the first pull down circuit 215 shall not be limited to above forms.

It is to be noted that, transistors shown in FIG. 2 are all N type transistors, i.e. they may be formed by the same manufacturing process so as to reduce the manufacturing cost. For easy understanding, the embodiment is explained with an example in which all transistors are N type transistors, the high level is the active level, and the low level is the inactive level. Of course, such a setting may sometimes also be adopted in the embodiment that the low level is the active level, the high level is the inactive level, and/or a part or all of the N type transistors are replaced with P type transistors. For example, the following modifications may be made on the basis of the embodiment: transistors in FIG. 2 are all replaced with P type transistors, the high level and the low level of relevant signals are exchanged, e.g. the inactive level voltage line VSS is changed from outputting a low level to outputting a high level. It is easily understood that, such modifications will result in that the high level is modified into the low level, the low level is modified into the high level, potential pulling up is modified into potential pulling down, potential pulling down is modified into potential pulling up in the circuit principle, and the essence of the circuit principle remains unchanged. Therefore, the circuit structure, the circuit timing and the circuit principle after the modifications may be understood with reference to the above mentioned embodiment, and thus descriptions thereof will not be repeated herein.

Figure 3:
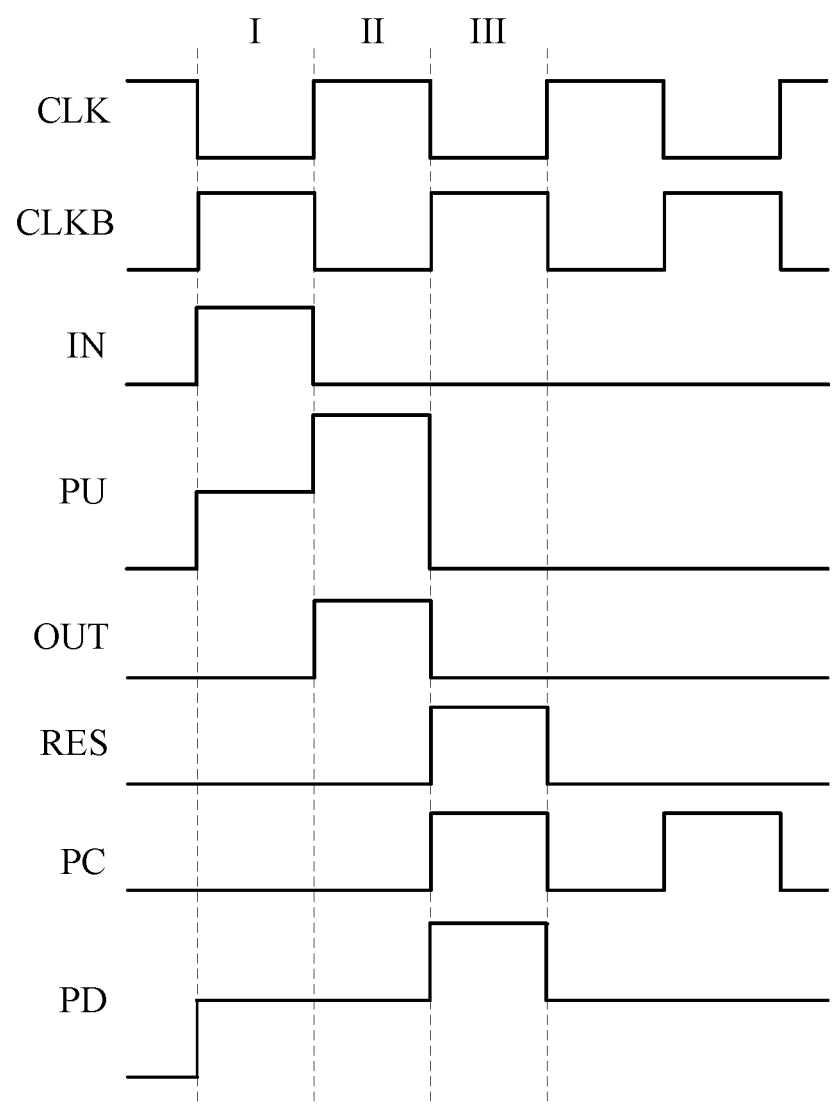
FIG. 3 is a circuit timing diagram of the shift register circuit as shown in FIG. 2.

FIG. 3 is a circuit timing diagram of the shift register circuit shown in FIG. 2. With reference to FIG. 3, operation stages of the above mentioned shift register circuit mainly include an input stage I, an output stage II and a reset stage III. With reference to FIG. 2 and FIG. 3, the operation principle of the above mentioned shift register circuit is briefly described as follows.

Before the input stage I, the input terminal IN, the reset terminal RES as well as the control signal PC all are remained at a low level, therefore all transistors in FIG. 2 are in a OFF state, and the shift register circuit has no signal output, and operates in a reset state.

In the input stage I, the input terminal IN is changed to the high level, the first transistor M1 and the seventh transistor M7 are turned on, the first node PU and the second node PD are pulled up to the high level, and the fourth transistor M4 is turned on. And since the control signal PC is remained at the low level, the second transistor M2 and the third transistor M3 are remained in the OFF state. At this time, the first clock signal line CLK is at the low level, the output terminal OUT is remained at the low level under the action of pulling down by the fourth transistor M4 which is turned on. Thus, the first terminal of the second capacitor C2 is at the high level of the first node PU, and the second terminal thereof is at the low level of the output terminal OUT, and the second capacitor C2 is in a state of being charged. Moreover, the first terminal of the first capacitor C1 is at the high level of the second node PD, the second terminal thereof is at the low level of the reset terminal RES, and the first capacitor C1 is in a state of being charged.

In the output stage II, the input terminal IN is changed to the low level, and the first clock signal line CLK is changed to the high level. Under the action of charge maintaining by the second capacitor C2, as the potential on the first clock signal line CLK is changed from the low level to the high level, the first node PU jumps to the higher level with the higher potential. This causes the fourth transistor M4 to be fully turned on, completes the potential pulling up at the output terminal OUT fast, i.e. outputting of the gate drive signal is started at the output terminal OUT.

In the reset stage III, the reset terminal RES is changed to the high level, the first clock signal line CLK is changed to the low level, the control signal PC is changed to the high level. Under the high level at the reset terminal RES, the fifth transistor M5 and the sixth transistor M6 are turned on to pull down the potentials at the first node PU and the output terminal OUT respectively. Under the action of charge maintaining by the first capacitor C1, as the potential at the reset terminal RES is changed from the low level to the high level, the second node PD will jump to a higher level with a higher potential. Moreover, under the high level of the control signal PC, the second transistor M2 will connect this higher level with the higher potential to the gate of the third transistor M3, so that the third transistor M3 is fully turned on, and the potential at the output terminal OUT is pulled down rapidly, i.e. outputting of the gate drive signal is stopped at the output terminal OUT.

After the reset stage III, the reset terminal RES is changed to the low level, and the control signal PC is the same as the clock signal on the second clock signal line CLKB. Thereby, when the control signal PC and the second clock signal line CLKB are at the high level, the high level stored at the first terminal of the first capacitor C1 will cause the third transistor M3 to be turned on, so that the output terminal OUT is pulled down to the low level, and the noise voltage at the output terminal OUT is released.

It can be seen that, if there are no the pull down control circuit 214 and the first pull down circuit 215, in the reset stage III the pull-down rate at the input terminal OUT will be greatly reduced, and also the noise voltage at the output terminal OUT can not be released after the reset stage III. This may result in problems at the output terminal OUT, such as, too much delay, too much noise, being unable to reach the low level after the reset stage III ends, which lead to display abnormality. Moreover, in comparison with the design in the relevant art, in the present embodiment, only three transistors and one capacitor are used to achieve the function of fast pulling down the potential and releasing noise, therefore fewer transistors with smaller sizes can be used, and faster potential pulling down can be achieved in the shift register circuit, thereby optimized signal output performance can be obtained.

It is to be noted that, in an embodiment of the present disclosure, the control signal PC as shown in FIG. 3 actually is triggered by, e.g., the signal at the input terminal IN or the output terminal OUT, and is changed from the low level to the same waveform as that on the second clock signal line CLKB after being triggered, and this may be achieved by, for example, a flip-flop structure. And the present disclosure shall not be limited thereto.

It is also to be noted that, in an embodiment of the present disclosure, the shift register circuit may further include, on the basis of any one of the above mentioned structures: a second pull down circuit (not shown in the drawings) which is connected to the first node and the second node respectively, and is configured to, when a control signal which is connected thereto is at the active level and the second node PD is at the active level, set the first node to the inactive level at a rate corresponding to the potential height at the second node PD. In some embodiments, the further the potential height at the second node gets away from the inactive level, the higher the rate at which the second pull down circuit sets the first node to the inactive level is. In some embodiments, the second pull down circuit includes an eighth transistor and a ninth transistor, wherein the eighth transistor has a gate connected to the control signal, a first pole connected to the second node, and a second pole connected to the gate of the ninth transistor; and the ninth transistor has a first pole connected to the first node, and a second pole connected to the inactive level voltage line VSS which may provide the inactive level voltage of the first node PU; wherein the active level of the control signal is a level which enables the eighth transistor to be turned on between the first pole and the second pole. As such, when the control signal and the second node are both at the high level, the eighth transistor and the ninth transistor are both turned on, so that the potential at the gate of the ninth transistor is consistent or approximately consistent with the potential at the second node. Moreover, the higher the potential at the gate of the ninth transistor is, the larger the source-drain current thereof is, and the higher the rate at which the potential of the first node is pulled down is. That is, the above mentioned function of, when the control signal which is connected is at the active level and the second node PD is at the active level, setting the first node to the inactive level at the rate corresponding to the potential height at the second node PD, is achieved. In some embodiments, the gate of the eighth transistor is connected to the reset terminal, thereby a control signal is provided by the reset terminal, so that after the reset terminal is changed from the low level to the high level, the gate of the eighth transistor and the second node can both be at the above mentioned higher level with the higher potential, and fast pulling down of the first node is achieved. Of course, the circuit structure of the second pull down circuit shall not be limited to above forms.

Figure 4:
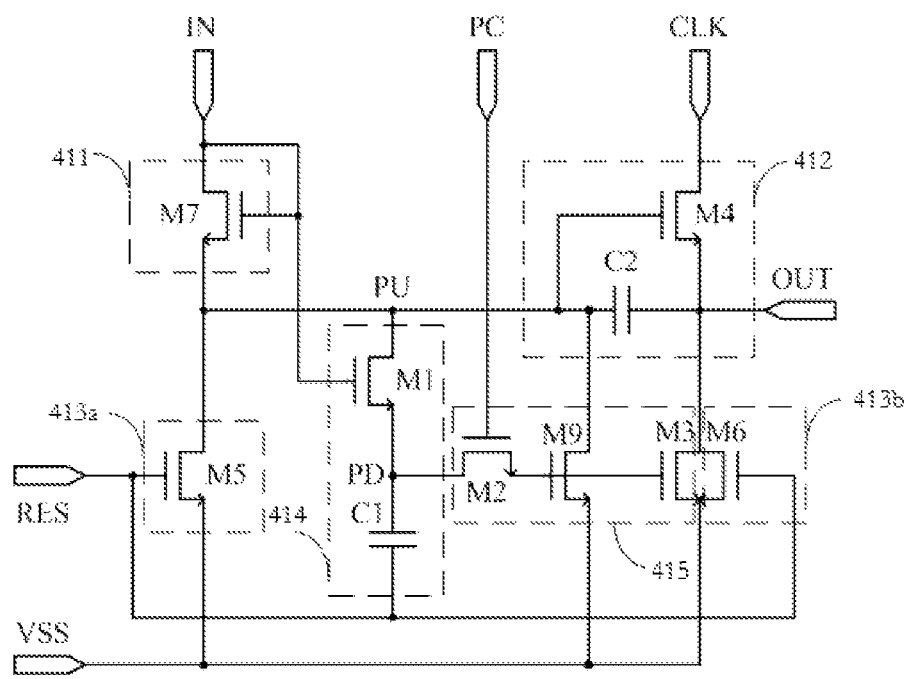
FIG. 4 is a circuit structure diagram of a shift register circuit provided by other some embodiments of the present disclosure.

In addition, based on association between the first pull down circuit and the second pull down circuit, the second pull down circuit may be merged into the first pull down circuit. FIG. 4 shows an embodiment of such a case, wherein, similarly to the structure of the shift register circuit of FIG. 2, the shift register circuit exemplified in FIG. 4 includes an input circuit 411, an output circuit 412, a reset circuit 413 (including a first part 413a and a second part 413b), a pull down control circuit 414; these components are similar to the corresponding ones in the shift register circuit of FIG. 2.

In addition, similarly to FIG. 2, the shift register circuit exemplified in FIG. 4 also includes a first pull down circuit 415. As shown in FIG. 4, in comparison with the first pull down circuit 215 shown in FIG. 2, the first pull down circuit 415 in FIG. 4 has a ninth transistor M9 added, the ninth transistor M9 having a gate connected to the second pole of the second transistor M2, a first pole connected to the first node PU, and a second pole connected to the inactive level voltage line VSS which may provide the inactive level voltage of the first node PU. As such, the second transistor and the eighth transistor are merged into one transistor, and in the reset stage III, the second node PD can simultaneously act on the third transistor M3 and the ninth transistor M9, thus fast pulling down of the potentials at the first node PD and the output terminal OUT can be simultaneously achieved. Moreover, after the reset stage III, noises at the first node PD and at the output terminal OUT can both be released. Thus, it is possible to achieve optimized circuit output performance.

Based on the same inventive concept, another embodiment of the present disclosure provides a drive method for any of the above mentioned shift register circuits comprising:

when the reset terminal is changed from the inactive level to the active level, changing the control signal which is connected to the first pull down circuit from the inactive level to the active level.

Steps of the drive method of the present embodiment correspond to the waveform of the above mentioned control signal PC, therefore, specific implementations thereof can be readily understood with reference to the above mentioned examples, and are not repeatedly described herein.

It can be seen that, the output terminal (and/or the first node) can be fast pulled down or fast pulled up according the drive method of the present embodiment in cooperation with any of the above mentioned shift register circuits, thus the problem that the manner of potential pulling down in the relevant art can not satisfy application demands can be solved. In comparison with to the relevant art, according to the embodiments of the present disclosure, fewer transistors of smaller size can be used, faster potential pulling down can be achieved in the shift register circuit, thereby optimized signal output performance can be obtained.

Based on the same inventive concept, another embodiment of the present disclosure provides a scan drive circuit comprising several stages of any of the above mentioned shift register circuits. In each gate drive circuit: except the first stage shift register circuit, the input terminal of the shift register circuit of any stage is connected to an output terminal of a shift register circuit of a previous stage; except the first stage shift register circuit, an output terminal of a shift register circuit of any stage is connected to a reset terminal of the shift register circuit of the previous stage. Moreover, in order to achieve correct signal timing, a first clock signal line with which an odd-numbered stage shift register circuit is connected serves as a second clock signal line with which an even-numbered stage shift register circuit is connected, and a second clock signal line with which an odd-numbered stage shift register circuit is connected serves as a first clock signal line with which an even-numbered stage shift register circuit is connected. That is, except the first stage, the connection manner for the clock signals of any stage shift register circuit is contrary to that for the previous stage shift register circuit. Based on that the shift register circuits can obtain optimized circuit performance, the scan drive circuit can also obtain the optimized circuit performance.

Based on the same inventive concept, another embodiment of the present disclosure provides an array substrate comprising any of the above mentioned shift register circuits or at least one scan drive circuit of the above mentioned scan drive circuits. In some embodiments, the array substrate is provided with several of any of the above mentioned scan drive circuits outside a display region. Based on that optimized circuit performance can be obtained with the shift register circuit or the scan drive circuit, the array substrate can also obtain optimized performance.

Based on the same inventive concept, another embodiment of the present disclosure provides a display device comprising any of the above mentioned shift register circuits, any of the above mentioned scan drive circuits or any of the above mentioned array substrates. The display device according to the embodiment of the present disclosure may be a display panel, a cellphone, a tablet computer, a TV set, a display, a notebook computer, a digital photo frame, a navigator, or any product or component which has a display function. Based on that optimized performance can be obtained with the shift register circuit, the scan drive circuit or the array substrate, the display device can also obtain optimized performance.

The above are merely some preferred embodiments of the present disclosure, and are not intended to limit the scope of the present disclosure. Any modifications, equivalent substitutions, improvements, etc., that fall within the spirit and scope of the present disclosure are embraced within the scope of the present disclosure.

What is claimed is:

1. A shift register circuit comprising an input terminal, a reset terminal and an output terminal, further comprising:
    an input circuit connected to the input terminal and a first node respectively, and configured to, when the input terminal is at an active level, set the first node to an active level;
    an output circuit connected to the first node and the output terminal respectively, and configured to, when the first node is at the active level, set the output terminal to an active level with use of a clock signal;
    a reset circuit connected to the reset terminal, the first node and the output terminal respectively, and configured to, when the reset terminal is at the active level, set the first node and the output terminal to an inactive level;
    a pull down control circuit connected to the reset terminal and a second node respectively, and configured to set the second node to an active level in a time period in which the first node is at the active level, and to cause a potential at the second node to change in a direction of getting away from the inactive level when the reset terminal is changed from the inactive level to the active level;
    a first pull down circuit connected to the second node and the output terminal respectively, and configured to, when a control signal which is connected thereto is at the active level and the second node is at the active level, set the output terminal to the inactive level at a rate which is corresponding to the potential at the second node,
    wherein the pull down control circuit includes a first transistor and a first capacitor,
    wherein the first transistor has a gate connected to the input terminal or the first node, a first pole connected to the first node, and a second pole connected to the second node so that a current flows between the first node and the second node when the gate is at an active level, and
    wherein the first capacitor has a first terminal connected to the second node and a second terminal connected to the reset terminal.

2. The shift register circuit according to claim 1, wherein the first pull down circuit includes a second transistor and a third transistor; wherein,
    the second transistor has a gate connected to the control signal or the reset terminal, a first pole connected to the second node, and a second pole connected to a gate of the third transistor;
    the third transistor has a first pole connected to the output terminal, and a second pole connected to the inactive level voltage of the output terminal;
    wherein the active level of the control signal is a level which enables the second transistor to be turned on between the first pole and the second pole thereof; and
    wherein the first pole is one of a source and a drain, and the second pole is the other.

3. The shift register circuit according to claim 2, wherein the output circuit includes a second capacitor and a fourth transistor; wherein,
    the second capacitor has a first terminal connected to the first node, and a second terminal connected to the output terminal;
    the fourth transistor has a gate connected to the first node, a first pole connected to the clock signal, and a second pole connected to the output terminal.

4. The shift register circuit according to claim 3, wherein the reset circuit includes a fifth transistor and a sixth transistor; wherein,
    the fifth transistor has a gate connected to the reset terminal, a first pole connected to the first node, and a second pole connected to the inactive level voltage of the first node;
    the sixth transistor has a gate connected to the reset terminal, a first pole connected to the output terminal, and a second pole connected to the inactive level voltage of the output terminal.

5. The shift register circuit according to claim 4, wherein the input circuit includes a seventh transistor; wherein,
    the seventh transistor has a gate and a first pole connected to the input terminal, and a second pole connected to the first node.

6. The shift register circuit according to claim 1, wherein the shift register circuit further includes:
    a second pull down circuit connected to the second node and the first node respectively, and configured to, when a control signal which is connected thereto is at the active level and the second node is at the active level, set the first node to the inactive level at a rate which is corresponding to the potential at the second node.

7. The shift register circuit according to claim 6, wherein the second pull down circuit includes an eighth transistor and a ninth transistor, wherein,
    the eighth transistor has a gate connected to the control signal, a first pole connected to the second node, a second pole connected to a gate of the ninth transistor;
    the ninth transistor has a first pole connected to the first node, and a second pole connected to the inactive level voltage of the first node;
    wherein the active level of the control signal is a level which enables the eighth transistor to be turned on between the first pole and the second pole; and
    wherein the first pole is one of a source and a drain, and the second pole is the other.

8. A method of driving the shift register circuit according to claim 1 comprising:
    when the reset terminal is changed from the inactive level to the active level, changing the control signal which is connected to the first pull down circuit from the inactive level to the active level.

9. An array substrate comprising at least one scan drive circuit, the scan drive circuit comprising multiple stages of the shift register circuits according to claim 1.

10. A display device comprising the array substrate according to claim 9.

* * * * *